United States Patent [19]

Mittal et al.

[11] Patent Number: 4,488,592
[45] Date of Patent: Dec. 18, 1984

[54] OSCILLATING COOLANT PUMP

[75] Inventors: Faquir C. Mittal, Audubon; Edwin R. Phillips, Rosemont, all of Pa.

[73] Assignee: Sperry Corporation, New York, N.Y.

[21] Appl. No.: 525,859

[22] Filed: Aug. 24, 1983

[51] Int. Cl.³ .............................. F28C 3/00; F01B 7/10
[52] U.S. Cl. .................... 165/104.31; 92/37; 92/48; 60/581; 60/593
[58] Field of Search ...................... 60/581, 593, 547, 1, 60/549, 537, 567; 92/1, 37, 38, 48, 80; 165/80 A, 80 E, 47, 185, 104.31; 417/390, 393, 394, 395

[56] References Cited

U.S. PATENT DOCUMENTS

| | | | |
|---|---|---|---|
| 1,920,014 | 7/1933 | Horton et al. | 417/393 |
| 2,600,271 | 6/1952 | Schaevitz | 92/37 |
| 2,986,907 | 6/1961 | Hoop | 417/393 |
| 3,192,860 | 7/1965 | Hardison | 417/390 |
| 3,829,740 | 8/1974 | Beasley | 165/80 E |

FOREIGN PATENT DOCUMENTS

| | | | |
|---|---|---|---|
| 187553 | 12/1905 | Fed. Rep. of Germany | 165/104.31 |
| 631186 | 10/1949 | United Kingdom | 92/48 |

*Primary Examiner*—Robert E. Garrett
*Assistant Examiner*—Scott L. Moritz
*Attorney, Agent, or Firm*—James R. Bell; Thomas J. Scott; Marshall M. Truex

[57] ABSTRACT

An oscillating coolant pump includes a pair of opposed bellows mounted to reciprocate in a housing for moving a volume of fluid through a heat exchanger and an electronics package. The pump functions without the use of check valves.

7 Claims, 3 Drawing Figures

OSCILLATING COOLANT PUMP

BACKGROUND OF THE INVENTION

1. Field of the Invention

This invention relates generally to pumps and more particularly to those used to move heat exchange material by application of mechanical energy.

2. Description of the Prior Art

Coolant material is used to cool VLSI electronic packages. The coolant is circulated through a closed system utilizing a heat exchanger device. Pumps are commonly used to move the coolant through the system. The pumps often use inlet and outlet check valves to control direction of flow of the coolant. A limitation associated with the use of check valves is a decrease in system reliability due to the need for many moving parts. Should a check valve fail to function properly, a serious overheating problem could result in potential damage to the electronic package.

The foregoing illustrates limitations of the known prior art. Thus, it is apparent that it would be advantageous to provide an alternative directed to overcoming one or more of the limitations as set forth above. Accordingly, a suitable alternative is provided including features more fully disclosed hereinafter.

SUMMARY OF THE INVENTION

In one aspect of the present invention, this is accomplished by providing an oscillating coolant pump including a pump housing first and second voids separated by a divider. A pair of opposed bellows to an expanded position in response to movement of the other bellows to a contracted position. A first port extends through the divider for fluidly connecting one of the expansible chambers externally of the housing. A second port also extends through the divider and fluidly connects the other of the expansible chambers externally of the housing.

The foregoing and other aspects will become apparent from the following detailed description of the invention when considered in conjunction with the accompanying drawing. It is to be expressly understood, however, that the drawing is not intended as a definition of the invention but is for the purpose of illustration only.

DESCRIPTION OF THE PREFERRED EMBODIMENT

Figure 1:
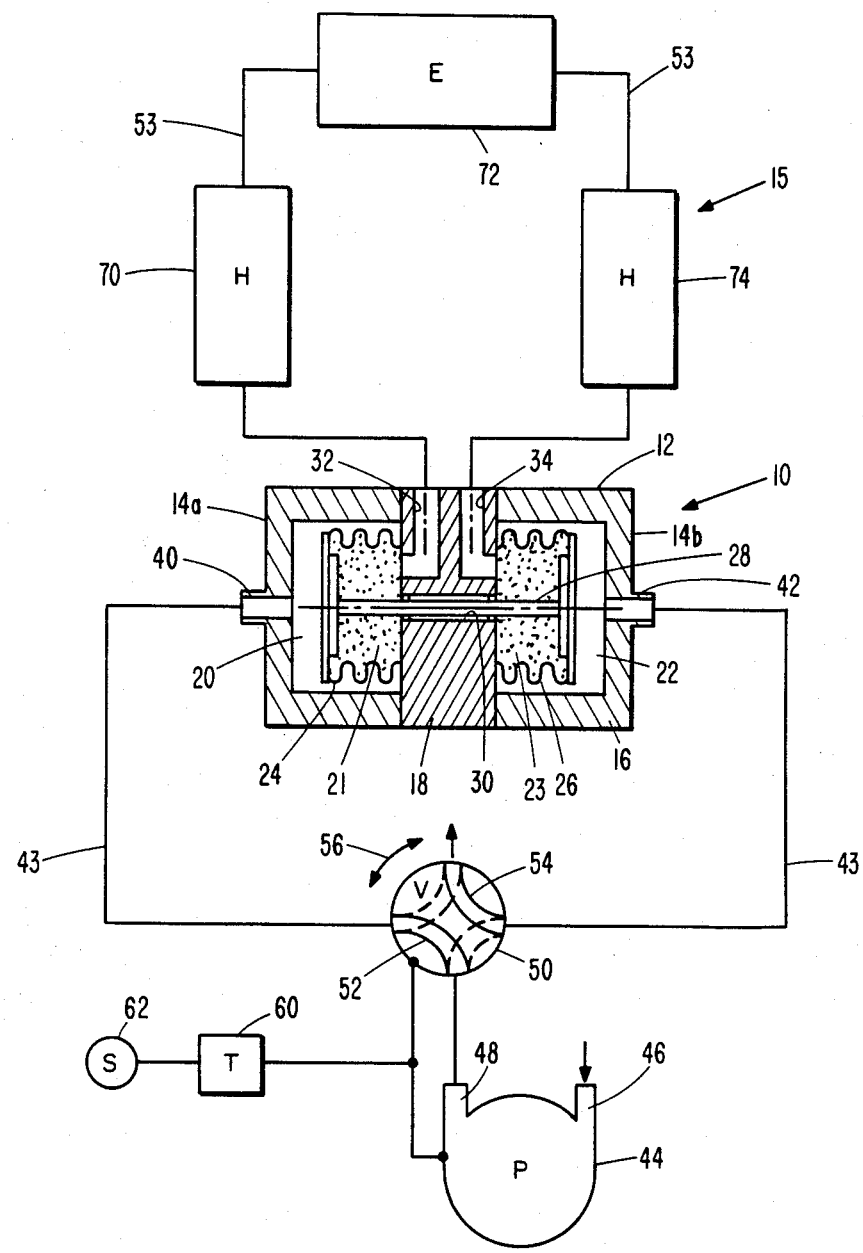
FIG. 1 is a view graphically illustrating an embodiment of the oscillating coolant pump of this invention connected with a system for cooling an electronic package.

An oscillating coolant pump is generally designated 10 in FIG. 1. Pump 10 is formed of a pump housing 12 including opposed endwalls 14a, 14b, and a sidewall 16. A divider 18 defines first and second voids 20, 22, respectively within housing 12.

A pair of opposed bellows 24, 26, form expansible chambers 21, 23 within voids 20, 22, respectively, and are movably mounted in housing 12. Bellows 24, 26 are interconnected by a reciprocable member 28, sealingly and slidably extending through an aperture 30 formed in divider 18. Bellows 24, 26, are also sealingly connected to divider 18. In this manner, reciprocating movement of member 28 causes either one of the bellows to be expanded in response to the other bellows being contracted.

Divider 18 includes a first port 32 extending therethrough providing fluid communication between chamber 21 and externally of housing 12. Also, divider 18 includes a second port 34, separate from port 32, providing fluid communication between chamber 23 and externally of housing 12. In this manner, reciprocable movement of member 28 in one direction results in a pumping action for moving a volume of fluid from chamber 21 through port 32 and externally of housing 12, while concurrently, a substantially equal volume of fluid is moved from externally of housing 12, through port 34 and into chamber 23. Reciprocable movement of member 28 in an opposite direction, empties fluid from chamber 23 and into chamber 21. This provides a reciprocating pump free of the use of check valves.

Means are operably connected for moving reciprocable member 28. This is accomplished, as illustrated in FIG. 1 by providing a port 40 in endwall 14a, connecting void 20 externally of housing 12, and a port 42 in endwall 14b, connecting void 22 externally of housing 12. A pump 44, takes in ambient air at inlet 46 and pumps pressurized air from outlet 48. The pressurized air is conducted to a valve 50 having passages 52, 54 and provided to rotate in an alternating motion as indicated by the arrow designated 56. As a result, passages 52, 54 are alternately moved to conduct pressurized air to one of ports 40, 42 via a conduit 43 while simultaneously exhausting fluid from the other of those ports. Movement of valve 50 is accomplished by electrical interconnection of valve 50 and pump 44 in combination with a timer 60 and an electrical power source 62. In this manner, pressurized air can cause reciprocating motion of member 28.

Figure 2:
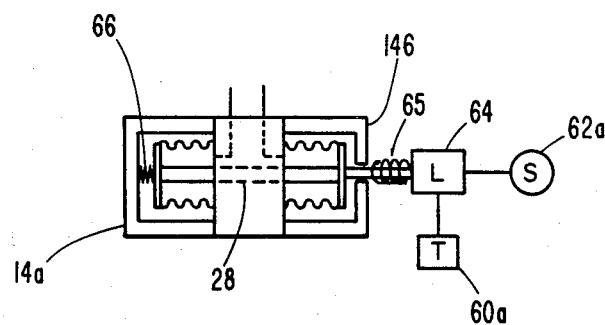
FIG. 2 is a view graphically illustrating an alternative embodiment.

Alternatively, as illustrated in FIG. 2, A solenoid 64 can be electrically connected to a timer 60a and an electrical power source 62a for providing motion to solenoid plunger 65 extending through sidewall 14b and connected to move reciprocable member 28 which is returned by a spring 66 compressed against sidewall 14a. In this manner, solenoid 64 can cause reciprocating motion of member 28. Other means such as cranks or cams could be used to move member 28.

Returning to FIG. 1, port 32 is fluidly connected in a cooling system generally designated 15 including a heat exchanger 70 which is fluidly connected via a conduit 53 to an electronics package 72. Port 34 is similarly fluidly connected to a heat exchanger 74 which is also fluidly connected via conduit 53 to electronics package 72. In this manner, a closed loop is formed fluidly interconnecting chambers 21, 23 via exchanger 70, package 72 and exchanger 74. Such a loop can be filled with an appropriate fluid coolant such as air, water or preferably fluorocarbon. The volume of chambers 21, 23 is sufficient to move a volume of coolant fluid sequentially through one of the heat exchangers 70, 74 and the electronics package 72.

Figure 3:
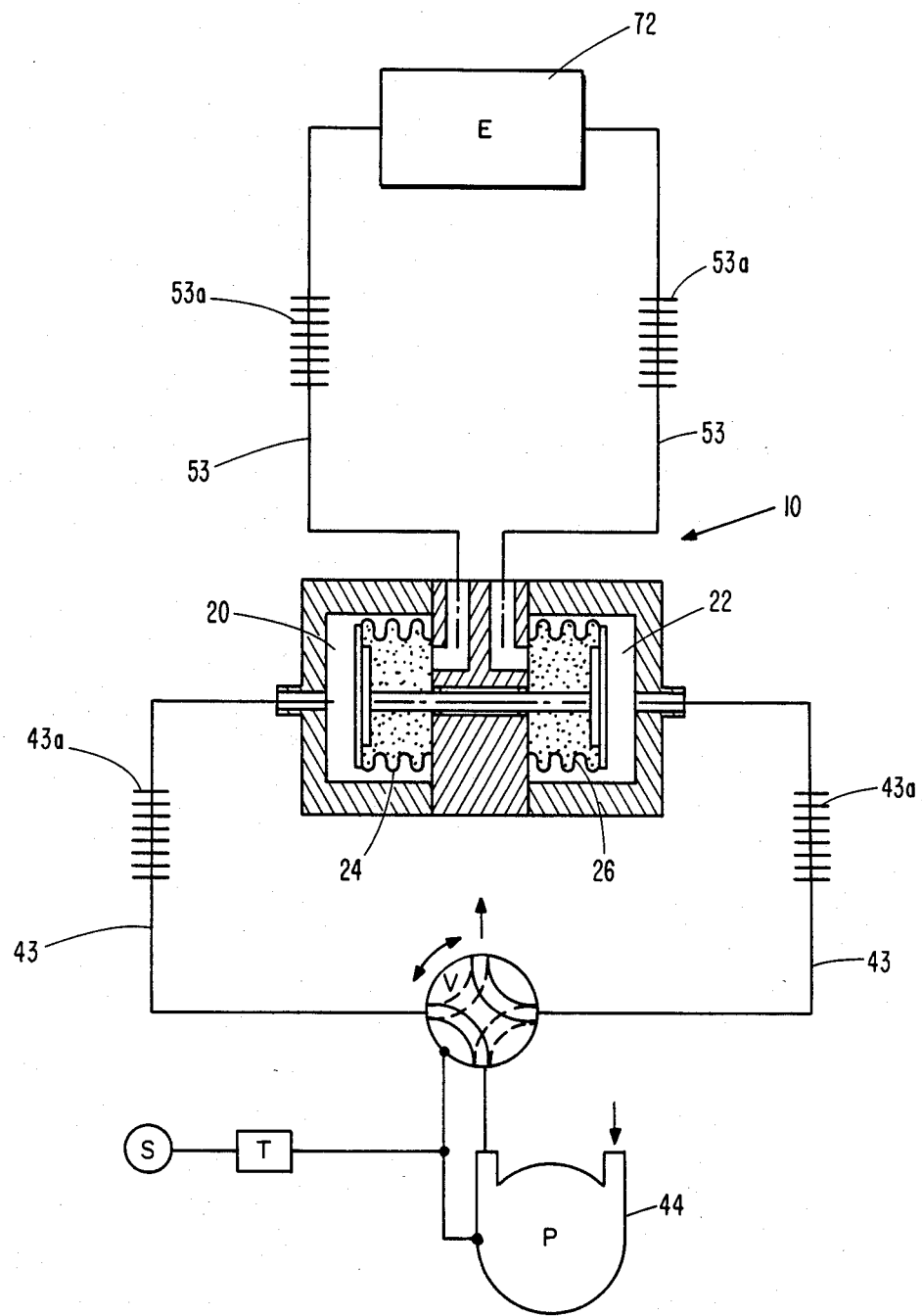
FIG. 3 is a view illustrating an alternative embodiment of the present invention.

FIG. 3 illustrates an alternative to the embodiment of FIG. 1. A cool fluid moved by pump 44 through conduit 43 can be in either a gaseous or a liquid state and can function as a coolant in voids 20, 22 to remove heat from the increased outer surface area of bellows 24, 26.

This fluid and the coolant fluid in conduit 53, being moved through package 72 by pump 10, can enhance cooling and limit the need for heat exchangers 70, 74. Additionally, fins 43a, 53a, added to conduits 43, 53, respectively, can further enhance heat rejection. In this manner, bellows 24, 26 can become a primary heat exchanger rejecting heat to the relatively cool liquid in conduit 53.

Advantages of system 15 include providing relatively large flow at low pressure, high reliability, compactness, relatively low energy input and low stress on components. The turbulence which accompanies reverse flow coolant introduced by the reciprocating motion of bellows 24, 26 improves heat transfer from electronics to coolant and from coolant to heat exchanger. This is so because the turbulent flow decreases the boundary layer characteristics which would otherwise exist if the system relied on laminar or steady flow. Also, the amount of heat rejected can be significant since high turbulence exists near flexing bellows 24, 26.

Materials used will be compatible with the coolant in the system. Components are commercially available and it is anticipated that the electronics package 72 utilizes the well-known cold plate concept.

The foregoing has described an oscillating coolant pump which can be utilized in a system to provide means to pump coolant between a heat source, such as package 72, and a heat sink, such as exchangers 70, 74, in a manner maximizing heat transfer and reliability. Pump 10 is a fluid oscillator driving a coolant which provides high turbulence for heat transfer with a minimum of moving parts. This is accomplished by providing a pump having an inlet and an outlet free of check valves normally found in reciprocating coolant pumps.

It is anticipated that aspects of the present invention, other than those specifically defined in the appended claims, can be obtained from the foregoing description and the drawings.

Having thus described the invention, what is claimed is:

1. An oscillating coolant pump comprising:
    a pump housing having first and second voids formed therein, said voids separated by a divider;
    first void port means for fluidly connecting only said first void externally of said housing, said first void port being free of check valves;
    second void port means for fluidly connecting only said second void externally of said housing, said second void port being free of check valves and being separate from said first void port;
    a pair of opposed bellows, each one of said bellows defining an expansible chamber in a respective one of said voids;
    reciprocable means extending through said divider for moving one of said bellows to an expanded position in response to movement of the other of said bellows to a contracted position;
    first bellows port means extending through said divider for fluidly connecting only one of said expansible chambers externally of said housing, said first bellows port being free of check valves and being separate from said void ports; and
    second bellows port means extending through said divider for fluidly connecting only the other of said expansible chambers externally of said housing, said second bellows port being free of check valves and being separate from said void ports and said first bellows port.

2. The pump of claim 1 including:
    means operably connected for moving said reciprocable means.

3. The pump of claim 2 including:
    a port fluidly connecting each of said voids externally of said housing; and
    fluid pressure operably connected to said void ports for moving said reciprocable means.

4. The pump of claim 2 including:
    a solenoid operably connected to move said reciprocable means.

5. A system for fluid cooling an electronics package comprising:
    a pump housing having first and second voids formed therein, said voids separated by a divider;
    first void port means for fluidly connecting only said first void externally of said housing, said first void port being free of check valves;
    second void port means for fluidly connecting only said second void externally of said housing, said second void port being free of check valves and being separate from said first void port;
    a pair of opposed bellows, each one of said bellows defining an expansible chamber in a respective one of said voids;
    reciprocable means extending through said divider for moving one of said bellows to an expanded position in response to movement of the other of said bellows to a contracted position;
    means operably connected for moving said reciprocable means;
    first bellows port means extending through said divider for fluidly connecting only one of said expansible chambers externally of said housing, said first bellows port being free of check valves and being separate from said void ports; and
    second bellows port means extending through said divider for fluidly connecting only the other of said expansible chambers externally of said housing, said second bellows port being free of check valves and being separate from said void ports and said first bellows port.

6. The system of claim 5 including:
    a pair of fluid ports in said package;
    a first heat exchanger connected to one of said pair of package fluid ports and also connected to said first bellows port; and
    a second heat exchanger connected to the other of said pair of package fluid ports and also connected to said second bellows port.

7. The system of claim 5 wherein each of said expansible chambers is of a volume sufficient to move a volume of coolant fluid through one of said heat exchangers and through said package.